United States Patent
Matsumura et al.

(10) Patent No.: US 12,160,221 B2
(45) Date of Patent: Dec. 3, 2024

(54) PIEZOELECTRIC RESONATOR UNIT AND METHOD OF MANUFACTURING THE SAME

(71) Applicant: Murata Manufacturing Co., Ltd., Nagaokakyo (JP)

(72) Inventors: Takeya Matsumura, Nagaokakyo (JP); Shinsuke Kawamori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 753 days.

(21) Appl. No.: 17/349,083

(22) Filed: Jun. 16, 2021

(65) Prior Publication Data

US 2021/0313956 A1   Oct. 7, 2021

Related U.S. Application Data

(63) Continuation of application No. PCT/JP2020/010538, filed on Mar. 11, 2020.

(30) Foreign Application Priority Data

Mar. 28, 2019 (JP) ................................. 2019-062189

(51) Int. Cl.
  *H03H 9/13* (2006.01)
  *H03H 3/02* (2006.01)
  (Continued)

(52) U.S. Cl.
  CPC .............. *H03H 9/131* (2013.01); *H03H 3/04* (2013.01); *H03H 9/1021* (2013.01); *H03H 9/19* (2013.01);
  (Continued)

(58) Field of Classification Search
  CPC ........ H03H 9/131; H03H 9/1021; H03H 9/19; H03H 9/0519
  See application file for complete search history.

(56) References Cited

U.S. PATENT DOCUMENTS

| 8,093,785 | B2 | 1/2012 | Wada |
| 8,766,514 | B2 * | 7/2014 | Il ........................ H03H 9/02023 |
| | | | 310/368 |

(Continued)

FOREIGN PATENT DOCUMENTS

| JP | 2000151345 A | 5/2000 |
| JP | 2001196889 A * | 7/2001 |

(Continued)

OTHER PUBLICATIONS

International Search Report issued for PCT/JP2020/010538, date of mailing Jun. 16, 2020.

(Continued)

*Primary Examiner* — J. San Martin
(74) *Attorney, Agent, or Firm* — ArentFox Schiff LLP

(57) ABSTRACT

A method of manufacturing a piezoelectric resonator unit that includes mounting a piezoelectric resonator on a base member, the piezoelectric resonator including a piezoelectric element and a pair of excitation electrodes facing each other with the piezoelectric element interposed therebetween, each of the pair of excitation electrodes including an underlying layer containing chromium and a surface layer on the underlying layer; forming chromium oxide on the surface layer of each of the pair of excitation electrodes by oxidizing chromium diffused from the underlying layer such that an amount of the chromium oxide is larger on the surface layer of the excitation electrode on a base member side than on the surface layer of the excitation electrode on a lid member side among the pair of excitation electrodes; and joining a lid member to the base member such that the piezoelectric resonator is between the base member and the lid member.

8 Claims, 13 Drawing Sheets

(51) Int. Cl.
 *H03H 3/04* (2006.01)
 *H03H 9/10* (2006.01)
 *H03H 9/19* (2006.01)

(52) U.S. Cl.
 CPC ............. *H03H 2003/022* (2013.01); *H03H 2003/0457* (2013.01)

(56) References Cited

U.S. PATENT DOCUMENTS

| | | | |
|---|---|---|---|
| 9,496,480 B2 * | 11/2016 | Naito | H10N 30/101 |
| 10,804,876 B2 | 10/2020 | Kaga | |
| 2009/0106960 A1 * | 4/2009 | Tsuchido | H03H 9/1035 29/25.35 |
| 2010/0244630 A1 | 9/2010 | Wada | |
| 2013/0249353 A1 | 9/2013 | Naito et al. | |
| 2018/0167051 A1 | 6/2018 | Kaga | |

FOREIGN PATENT DOCUMENTS

| | | |
|---|---|---|
| JP | 2003078383 A | 3/2003 |
| JP | 2006270465 A | 10/2006 |
| JP | 2010232806 A | 10/2010 |
| JP | 2013197916 A | 9/2013 |
| JP | 2015065554 A | 4/2015 |
| JP | 2015233218 A | 12/2015 |
| JP | 2016144091 A | 8/2016 |
| JP | 2016197813 A | 11/2016 |
| JP | 2018098592 A | 6/2018 |

OTHER PUBLICATIONS

Written Opinion of the International Searching Authority issued for PCT/JP2020/010538, date of mailing Jun. 16, 2020.

* cited by examiner

PIEZOELECTRIC RESONATOR UNIT AND METHOD OF MANUFACTURING THE SAME

CROSS REFERENCE TO RELATED APPLICATIONS

The present application is a continuation of International application No. PCT/JP2020/010538, filed Mar. 11, 2020, which claims priority to Japanese Patent Application No. 2019-062189, filed Mar. 28, 2019, the entire contents of each of which are incorporated herein by reference.

FIELD OF THE INVENTION

The present invention relates to a piezoelectric resonator unit and a method of manufacturing the same.

BACKGROUND OF THE INVENTION

A piezoelectric resonator unit is mounted on a mobile communication device or the like and is used as, for example, a timing device or a load sensor. The piezoelectric resonator unit includes, for example, a base member, a lid member joined to the base member by a joining member, and a piezoelectric resonator held by a conductive holding member in an internal space formed between the base member and the lid member.

Patent Document 1 discloses a piezoelectric resonator unit in which a piezoelectric resonator includes a piezoelectric substrate having a first surface and a second surface facing each other, a first electrode film formed on the first surface and electrically connected to a first adhesive portion, and a second electrode film formed on the second surface and electrically connected to a second adhesive portion. In Patent Document 1 a fluororesin film is also formed in a movable region that is a region of the piezoelectric resonator that is not supported by the first adhesive portion and the second adhesive portion.

Patent Document 2 discloses an electrode structure of a resonator including an underlying layer containing chromium and an upper layer containing gold, which are laminated in this order from a resonator substrate side, in which the underlying layer is film-formed in an oxygen atmosphere or a nitrogen atmosphere.

Patent Document 1: Japanese Unexamined Patent Application Publication No. 2010-232806
Patent Document 2: Japanese Unexamined Patent Application Publication No. 2016-197813

SUMMARY OF THE INVENTION

In the piezoelectric resonator unit described in Patent Document 1, it is possible to suppress fluctuation in frequency over time due to chemical attraction of an organic substance evaporated from a conductive adhesive to the piezoelectric resonator. However, there has been a problem that the frequency fluctuates due to thermal degradation (for example, when the fluororesin film is a cyclic dimethylpolysiloxane molecular film, thermal degradation under a temperature environment of equal to or higher than 230° C.) of the fluororesin film formed in the movable region.

In the electrode structure of the resonator described in Patent Document 2, it is possible to reduce variation in frequency between individuals due to diffusion of chromium from the underlying layer to the upper layer. However, there has been a problem that the frequency varies over time due to chemical attraction of an organic substance evaporated from a conductive adhesive to the electrode.

The present invention has been made in view of such circumstances, and an object of the present invention is to provide a piezoelectric resonator unit with improved reliability and a method of manufacturing the same.

A method of manufacturing a piezoelectric resonator unit according to an aspect of the present invention includes mounting a piezoelectric resonator on a base member by a conductive holding member, the piezoelectric resonator including a piezoelectric element and a pair of excitation electrodes facing each other with the piezoelectric element interposed therebetween, each of the pair of excitation electrodes including an underlying layer containing chromium and a surface layer on the underlying layer; forming chromium oxide on the surface layer of each of the pair of excitation electrodes by oxidizing the chromium diffused from the underlying layer such that an amount of the chromium oxide is larger on the surface layer of the excitation electrode on a base member side than on the surface layer of the excitation electrode on a lid member side among the pair of excitation electrodes; and joining a lid member to the base member such that the piezoelectric resonator is located between the base member and the lid member.

A piezoelectric resonator unit according to another aspect of the invention includes a base member, a piezoelectric resonator having a piezoelectric element and a first excitation electrode and a second excitation electrode facing each other with the piezoelectric element interposed therebetween, the second excitation electrode facing the base member, a first conductive holding member and a second conductive holding member that mount the piezoelectric resonator on the base member and are respectively electrically connected to the first excitation electrode and the second excitation electrode, and a lid member joined to the base member such that the piezoelectric resonator is located between the lid member and the base member, in which each of the first excitation electrode and the second excitation electrode includes an underlying layer containing chromium as a main component thereof and a surface layer containing gold as a main component thereof, wherein an amount of the chromium diffused onto a surface of the surface layer is larger in the second excitation electrode than in the first excitation electrode, and $Cr_2O_3$ is on at least a part of the surface of the surface layer in the first excitation electrode and the second excitation electrode.

The present invention can provide a piezoelectric resonator unit with improved reliability and a method of manufacturing the same.

DETAILED DESCRIPTION OF THE PREFERRED EMBODIMENTS

Figure 1:
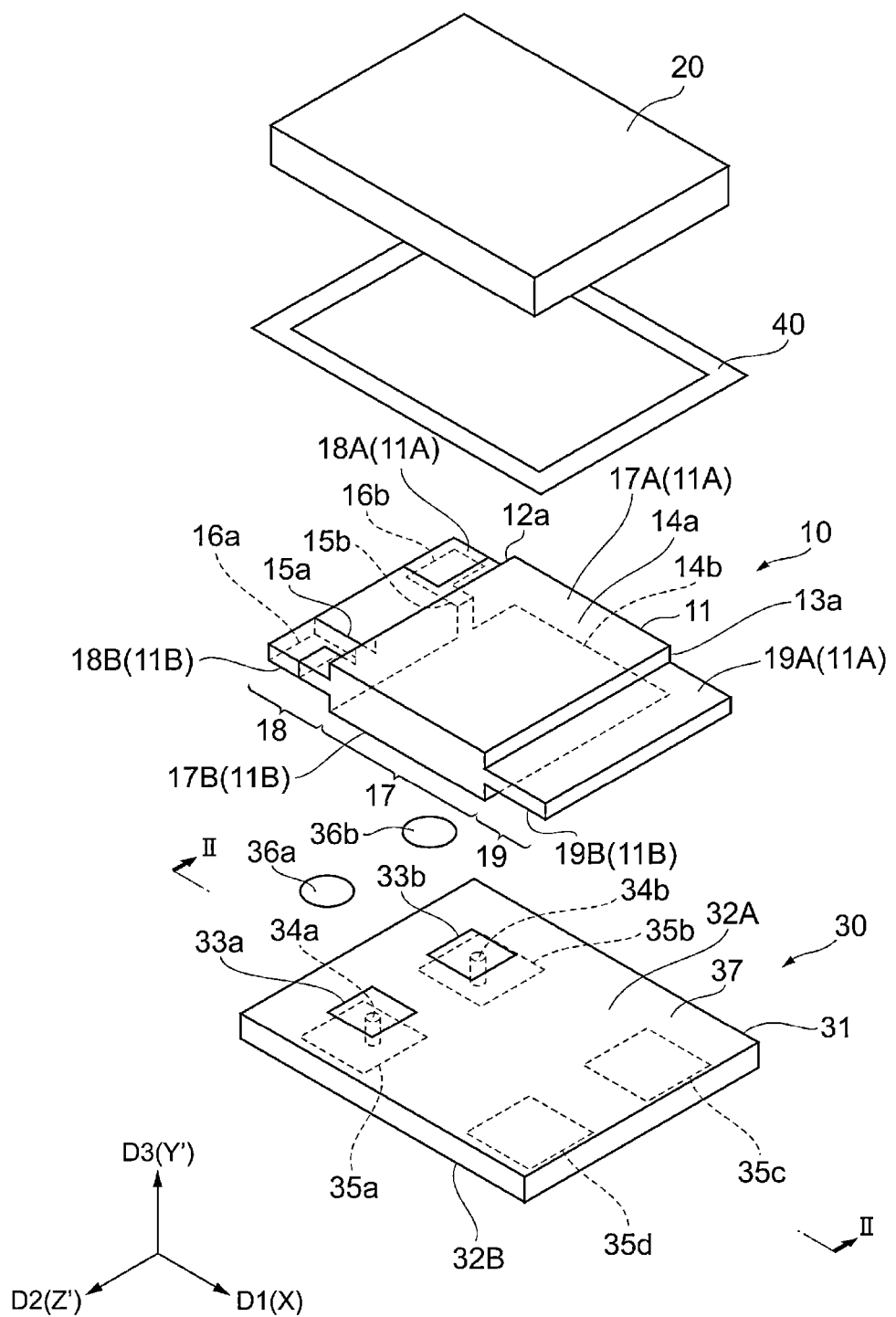
FIG. 1 is an exploded perspective view schematically illustrating the configuration of a quartz crystal resonator unit according to a first embodiment.

Hereinafter, embodiments of the present invention will be described with reference to the drawings. In the following description of the drawings, the same or similar components are denoted by the same or similar reference numerals. The drawings are illustrative, dimensions and shapes of respective components are schematic, and the technical range of the invention should not be construed as being limited to the embodiments.

An orthogonal coordinate system including a first direction D1, a second direction D2, and a third direction D3 may be added to each drawing for the convenience in order to clarify relationships between the drawings and to facilitate understanding of positional relationships among members. The first direction D1, the second direction D2, and the third direction D3 indicate three reference directions illustrated in FIG. 1, and each of them includes a direction of an arrow (positive direction) and a direction opposite to the arrow (negative direction).

In the following description, a quartz crystal resonator unit including a quartz crystal resonator will be described as an example of a piezoelectric resonator unit. The quartz crystal resonator uses a quartz crystal element as a piezoelectric body that vibrates in response to an applied voltage. The quartz crystal resonator unit corresponds to an example of the piezoelectric resonator unit, the quartz crystal resonator corresponds to an example of a piezoelectric resonator, and the quartz crystal element corresponds to an example of a piezoelectric element.

The piezoelectric element according to the embodiment of the invention is not limited to the quartz crystal element. The piezoelectric element may be made of any piezoelectric material such as a piezoelectric single crystal, a piezoelectric ceramic, a piezoelectric thin film, and a piezoelectric polymer film. Examples of the piezoelectric single crystal can include lithium niobate ($LiNbO_3$). Similarly, examples of the piezoelectric ceramic can include barium titanate ($BaTiO_3$), lead titanate ($PbTiO_3$), lead zirconate titanate ($Pb(Zr_xTi_{1-x})O_3$; PZT), aluminum nitride (AlN), lithium niobate ($LiNbO_3$), lithium metaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). Examples of the piezoelectric thin film can include materials that are provided by film-forming the above-described piezoelectric ceramic on a substrate made of quartz, sapphire, or the like by a sputtering method or the like. Examples of the piezoelectric polymer film can include polylactic acid (PLA), polyvinylidene fluoride (PVDF), and a vinylidene fluoride/trifluoroethylene copolymer (P(VDF/TrFE)). The above-described various piezoelectric materials may be laminated on each other or may be laminated on a member other than a piezoelectric material.

First Embodiment

Figure 2:
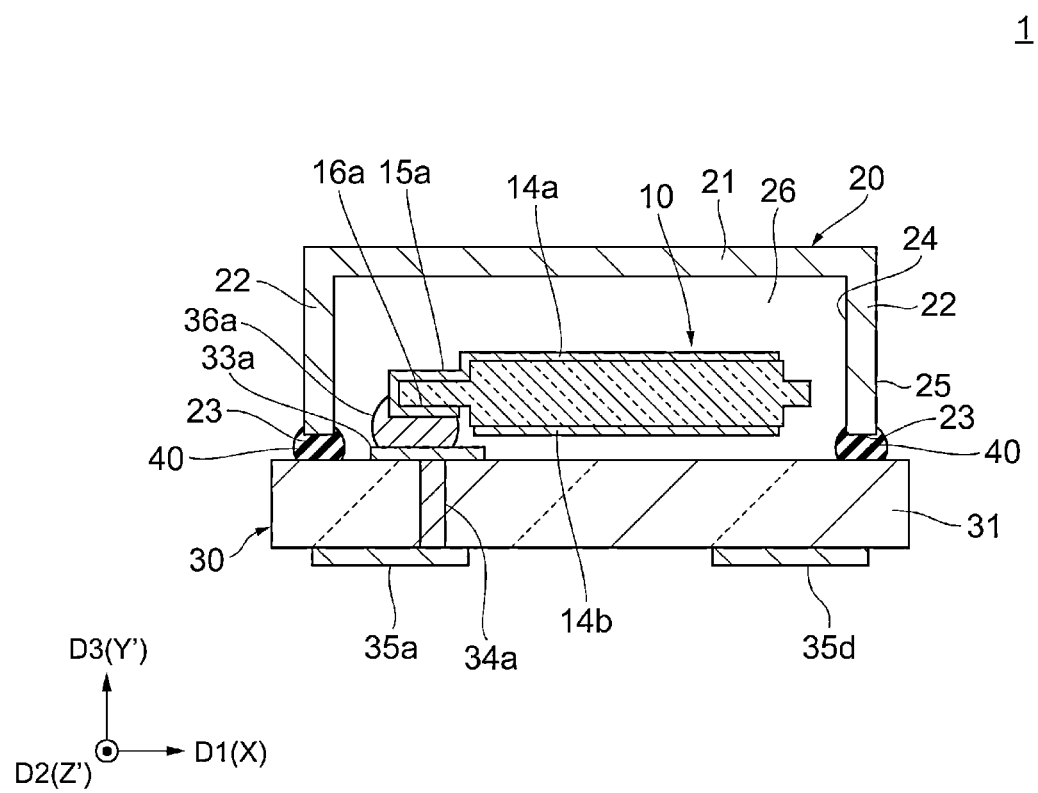
FIG. 2 is a cross-sectional view schematically illustrating the configuration of a cross section taken along a line II-II of the quartz crystal resonator unit illustrated in FIG. 1.
Figure 3:
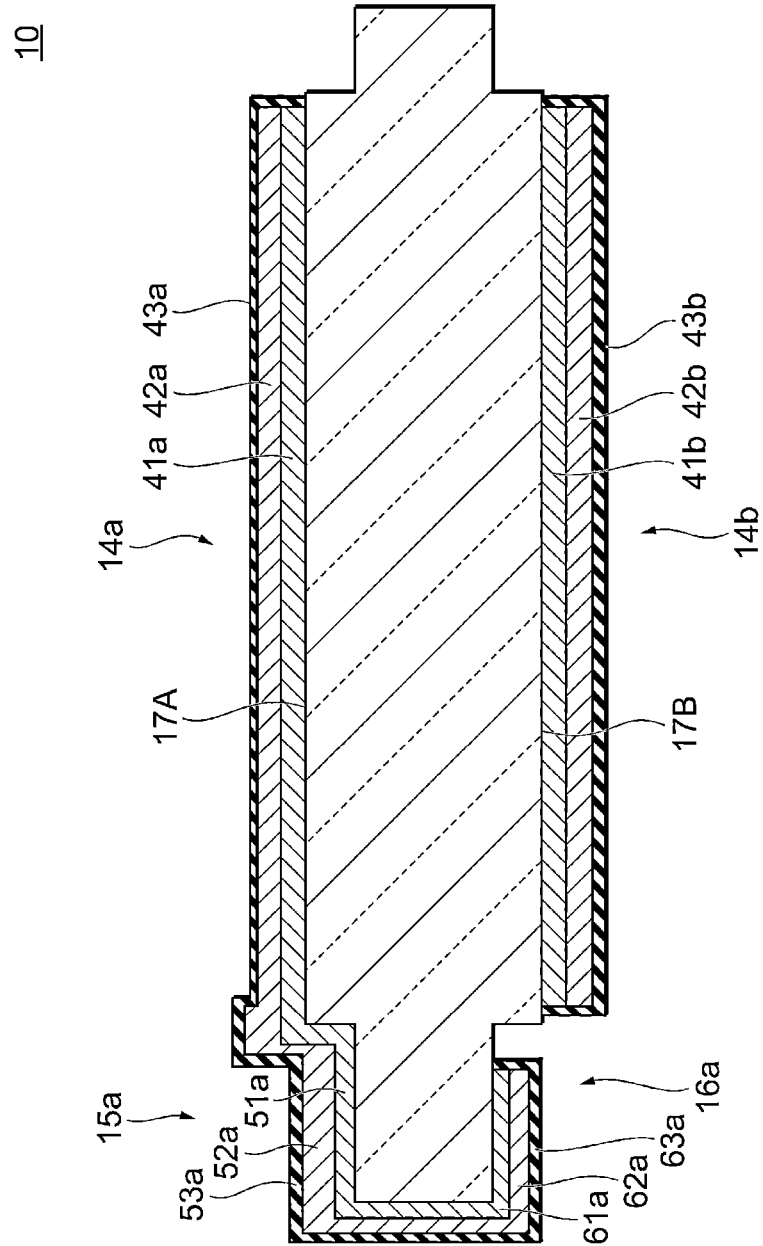
FIG. 3 is a cross-sectional view schematically illustrating the configuration of the quartz crystal resonator illustrated in FIG. 2.

The configuration of a quartz crystal resonator unit 1 according to a first embodiment of the invention will be described with reference to FIGS. 1 to 3. FIG. 1 is an exploded perspective view schematically illustrating the configuration of the quartz crystal resonator unit in the first embodiment. FIG. 2 is a cross-sectional view schematically illustrating the configuration of a cross section taken along a line II-II of the quartz crystal resonator unit illustrated in FIG. 1. FIG. 3 is a cross-sectional view schematically illustrating the configuration of the quartz crystal resonator illustrated in FIG. 2.

The quartz crystal resonator unit 1 includes a quartz crystal resonator 10, a lid member 20, a base member 30, and a joining member 40. The base member 30 and the lid member 20 are holders for accommodating the quartz crystal resonator 10. In the example illustrated in FIG. 1 and FIG. 2, the lid member 20 is formed into a recess shape. Specifically, the lid member 20 is formed into the recess shape and together with the base member 10 defines a space for accommodating the quartz crystal resonator 10. The base member 30 has a flat plate shape. The shapes of the lid member 20 and the base member 30 are not limited to those described above. For example, the shape of the lid member 20 may be a flat plate shape, and the shape of the base member 30 may be a recess shape having an opening on the lid member 20 side. Alternatively, both of the lid member 20 and the base member 30 may have recess shapes having openings on the sides facing each other.

The quartz crystal resonator 10 is an element that vibrates a quartz crystal by a piezoelectric effect and converts electrical energy and mechanical energy. The quartz crystal resonator 10 includes a thin quartz crystal element 11, a pair of a first excitation electrode 14a and a second excitation electrode 14b, a pair of a first extended electrode 15a and a second extended electrode 15b, and a pair of a first connection electrode 16a and a second connection electrode 16b.

The quartz crystal element 11 has a surface 11A and a back surface 11B facing each other. The surface 11A is located on the side opposite to the side facing the base member 30, that is, on the side facing a top surface portion 21 of the lid member 20, which will be described later. The back surface 11B is located on the side facing the base member 30.

The quartz crystal element 11 is, for example, an AT-cut quartz crystal element. The AT-cut quartz crystal element 11 is formed such that in an orthogonal coordinate system including an X axis, a Y' axis, and a Z' axis intersecting with one another, a surface parallel to a plane specified by the X axis and the Z' axis (hereinafter, referred to as an "XZ' plane", the same applies to planes specified by other axes or other directions) is a main surface and a direction parallel to the Y' axis is the thickness thereof. For example, the AT-cut quartz crystal element 11 is formed by etching a quartz crystal substrate (for example, a quartz crystal wafer)

obtained by cutting and polishing an ingot of a synthetic quartz crystal. The Y' axis and the Z' axis are axes obtained by rotating the Y axis and the Z axis about the X axis in the direction from the Y axis to the Z axis by 35 degrees 15 minutes±1 minute 30 seconds. The X axis, the Y axis, and the Z axis are crystallographic axes of a quartz crystal. The X axis corresponds to an electrical axis (polar axis), the Y axis corresponds to a mechanical axis, and the Z axis corresponds to an optical axis.

The quartz crystal resonator 10 using the AT-cut quartz crystal element 11 has high frequency stability in a wide temperature range. In the AT-cut quartz crystal resonator 10, a thickness shear vibration mode is used as main vibration. The rotation angles of the Y' axis and the Z' axis in the AT-cut quartz crystal element 11 may be inclined in a range of equal to or more than −5 degrees and equal to or less than 15 degrees from 35 degrees 15 minutes. As the cut-angle of the quartz crystal element 11, a different cut (for example, BT-cut) other than the AT-cut may be applied.

In the embodiment of the invention, the quartz crystal resonator 10 is arranged such that the X axis is parallel to the first direction D1, the Z' axis is parallel to the second direction D2, and the Y' axis is parallel to the third direction D3. Hereinafter, directions parallel to the X axis, the Y' axis, and the Z' axis are referred to as an X-axis direction, a Y'-axis direction, and a Z'-axis direction, respectively. That is, the X-axis direction corresponds to the first direction D1, the Z'-axis direction corresponds to the second direction D2, and the Y'-axis direction corresponds to the third direction D3. Further, in the X-axis direction, a +X-axis direction is a positive direction of the first direction D1, and a −X-axis direction is a negative direction of the first direction D1. Similarly, in the Y'-axis direction, a +Y'-axis direction is a positive direction of the third direction D3, and a −Y'-axis direction is a negative direction of the third direction D3. In the Z'-axis direction, a +Z'-axis direction is a positive direction of the second direction D2, and a −Z'-axis direction is a negative direction of the second direction D2. Therefore, the main surface of the AT-cut quartz crystal element 11 is parallel to a D1D2 plane specified by the first direction D1 and the second direction D2.

The AT-cut quartz crystal element 11 has a plate shape having a long-side direction in which long sides parallel to the X-axis direction extend, a short-side direction in which short sides parallel to the Z'-axis direction extend, and a thickness direction in which a thickness parallel to the Y'-axis direction extends. The quartz crystal element 11 has a rectangular shape when the surface 11A is seen in a plan view and includes an excitation portion 17 located at the center and contributing to excitation and peripheral portions 18 and 19 adjacent to the excitation portion 17. The excitation portion 17 and the peripheral portions 18 and 19 are each formed into a band shape from one end to the other end facing each other in the Z'-axis direction of the quartz crystal element 11. The peripheral portion 18 is located on the −X-axis direction side when viewed from the excitation portion 17, and the peripheral portion 19 is located on the +X-axis direction side when viewed from the excitation portion 17.

The shape of the excitation portion 17 when the surface 11A of the quartz crystal element 11 is seen in a plan view is not limited to having the band shape formed over the entire width from one end to the other end facing each other in the Z'-axis direction. For example, the excitation portion 17 may have an island shape that is adjacent to the peripheral portions also in the Z'-axis direction and is surrounded by the peripheral portions over the entire circumference. Also, the shapes of the peripheral portions 18 and 19 are not limited to having the band shapes formed over the entire widths from one ends to the other ends facing each other in the Z'-axis direction. The peripheral portion may be formed in a frame shape surrounding the excitation portion.

As illustrated in FIG. 1, on the surface 11A side of the quartz crystal element 11, the excitation portion 17 has a main surface 17A, the peripheral portion 18 has a main surface 18A, and the peripheral portion 19 has a main surface 19A. On the back surface 11B side of the quartz crystal element 11, the excitation portion 17 has a main surface 17B, the peripheral portion 18 has a main surface 18B, and the peripheral portion 19 has a main surface 19B.

The excitation portion 17 is thicker than the peripheral portions 18 and 19. The quartz crystal element 11 has a double-sided mesa structure. Vibration leakage from the excitation portion 17 can thereby be suppressed. In the example illustrated in FIG. 1 and FIG. 2, the excitation portion 17 protrudes from the peripheral portions 18 and 19 along the Y'-axis direction on both of the surface 11A side and the back surface 11B side of the quartz crystal element 11. In other words, on the surface 11A side of the quartz crystal element 11, a step is formed at the boundary between the main surface 17A of the excitation portion 17 and the main surface 18A of the peripheral portion 18, and a step is formed at the boundary between the main surface 17A of the excitation portion 17 and the main surface 19A of the peripheral portion 19. Also, on the back surface 11B side of the quartz crystal element 11, a step is formed at the boundary between the main surface 17B of the excitation portion 17 and the main surface 18B of the peripheral portion 18, and a step is formed at the boundary between the main surface 17B of the excitation portion 17 and the main surface 19B of the peripheral portion 19. The shape of the steps at the boundaries between the excitation portion 17 and the peripheral portions 18 and 19 is, for example, a tapered shape, but may be another shape such as a multi-step shape.

The shape of the quartz crystal element 11 is not limited to the above-described shape, and for example, the peripheral portion 19 may be omitted. In addition, the quartz crystal element 11 is not limited to having the double-sided mesa structure and may have a single-sided mesa structure in which the excitation portion 17 protrudes from the peripheral portions 18 and 19 only on one side of the surface 11A and the back surface 11B, an inverted mesa structure in which the excitation portion 17 is thinner than the peripheral portions 18 and 19, or the like. The quartz crystal element 11 may have a convex structure or a Becher structure in which the amount of change in thickness between the excitation portion 17 and the peripheral portions 18 and 19 continuously varies. The shape of the quartz crystal element 11 is not limited to the plate shape and may be, for example, a tuning fork shape having a base portion and a vibrating arm portion extending in parallel from the base portion.

The first excitation electrode 14a is provided on the main surface 17A of the excitation portion 17. The second excitation electrode 14b is provided on the main surface 17B of the excitation portion 17. In other words, the first excitation electrode 14a is provided on the lid member 20 side, and the second excitation electrode 14b is provided on the base member 30 side of the quartz crystal element 11. The first excitation electrode 14a and the second excitation electrode 14b face each other with the quartz crystal element 11 interposed therebetween in the third direction D3. The first excitation electrode 14a and the second excitation electrode 14b are arranged so as to substantially entirely overlap with each other in a XZ' plane. Each of the first excitation electrode 14a and the second excitation electrode 14b has long sides parallel to the X-axis direction, short sides parallel to the Z'-axis direction, and a thickness parallel to the Y'-axis direction.

As illustrated in FIG. 3, the first excitation electrode 14a includes an underlying layer 41a and a surface layer 42a, and the underlying layer 41a and the surface layer 42a are laminated in this order when seen from the quartz crystal element 11. The underlying layer 41a is made of a material having higher adhesion to the quartz crystal element 11 than a material of the surface layer 42a and contains chromium (Cr) as a main component. The surface layer 42a is made of a material having higher chemical stability than that of the material of the underlying layer 41a and contains gold (Au) as a main component. Chromium exists on the surface of the first excitation electrode 14a. Although not illustrated in FIG. 3, chromium derived from the underlying layer 41a diffuses in the surface layer 42a of the first excitation electrode 14a.

Similar to the first excitation electrode 14a, the second excitation electrode 14b includes an underlying layer 41b containing chromium as a main component and a surface layer 42b containing gold as a main component. Chromium exists on the surface of the second excitation electrode 14b. Chromium derived from the underlying layer 41b diffuses in the surface layer 42b of the second excitation electrode 14b similarly to the first excitation electrode 14a. In the example illustrated in FIG. 3, at least a part of the first excitation electrode 14a is thinner than the second excitation electrode 14b. This is because a part of the surface layer 42a of the first excitation electrode 14a is trimmed for the purpose of frequency adjustment. The film thickness of the underlying layer 41b of the second excitation electrode 14b is, for example, the same as the film thickness of the underlying layer 41a of the first excitation electrode 14a but may be different from that. The film thickness of the surface layer 42b of the second excitation electrode 14b is, for example, larger than the film thickness of the surface layer 42a of the first excitation electrode 14a but may be equal to or smaller than that.

As an example, chromium on the surfaces of the first excitation electrode 14a and the second excitation electrode 14b is substantially entirely oxidized and exists as chromium oxide. In other words, chromium oxide 43a is formed on substantially the entire surface of the first excitation electrodes 14a, and chromium oxide 43b is formed on substantially the entire surface of the second excitation electrodes 14b. In the chromium oxides 43a and 43b, more $Cr_2O_3$ is included than CrO, and for example, almost all are $Cr_2O_3$. A larger amount of chromium oxide is formed on the surface of the surface layer 42b of the second excitation electrode 14b than on the surface of the surface layer 42a of the first excitation electrode 14a. The amounts of chromium oxide on the surfaces of the surface layers 42a and 42b are compared in terms of the amount of chromium oxide per unit area when each of the surface layers 42a and 42b is seen in a plan view, for example. The amount of chromium oxide formed on each of the surfaces of the surface layers 42a and 42b of the first excitation electrode 14a and the second excitation electrode 14b is measured by, for example, energy dispersive X-ray spectroscopy (EDX), wavelength dispersive X-ray spectroscopy (WDX), or the like. An oxidation state of chromium, that is, a ratio of CrO to $Cr_2O_3$ is measured by, for example, X-ray photoelectron spectrometry (XPS) or the like.

Note that the analysis method is not limited to the above-described method, and the same analysis can be performed even using a qualitative and quantitative analysis method such as secondary ion mass spectrometry, electron beam microanalysis, Auger electron spectroscopy, and fluorescent X-ray analysis. The amount of chromium oxide or the oxidation state of chromium may be determined using a result of measurement at one place but may be desirably determined using an average value of results of measurement at a plurality of places, for example, two to ten places. When there are a plurality of measurement places, the measurement places adjacent to each other may be linearly or planarly aligned with substantially equal intervals. The size of a measurement region for determining the amount of chromium oxide and the oxidation state of chromium is not particularly limited and may be within a range that can be set when the above-described analyzer is used. In the invention, the above-described measurement region at one place is also referred to as a measurement area at one place.

Although in FIG. 3, the chromium oxide 43a is drawn in a thin film shape continuously extending along the main surface 17A in order to schematically illustrate the configuration in the embodiment, the chromium oxide 43a is not limited to be formed in the thin film shape covering the first excitation electrode 14a. The chromium oxide 43a may be formed in a mottled manner on the surface of the surface layer 42a of the first excitation electrode 14a. Similarly, the chromium oxide 43b may also be formed in a mottled manner on the surface of the surface layer 42b of the second excitation electrode 14b.

The first extended electrode 15a is provided on the main surface 18A of the peripheral portion 18 and electrically connects the first excitation electrode 14a and the first connection electrode 16a. The second extended electrode 15b is provided on the main surface 18B of the peripheral portion 18 and electrically connects the second excitation electrode 14b and the second connection electrode 16b. Each of the first extended electrode 15a and the second extended electrode 15b is formed also on the step at the boundary between the peripheral portion 18 and the excitation portion 17. From the viewpoint of reducing stray capacitance, the first extended electrode 15a and the second extended electrode 15b do not overlap with each other but are separated from each other when the surface 11A of the quartz crystal element 11 is seen in a plan view.

The first connection electrode 16a and the second connection electrode 16b are provided on the main surface 18B of the peripheral portion 18. The first excitation electrode 14a, the first extended electrode 15a, and the first connection electrode 16a are integrally formed. The same applies to the second excitation electrode 14b, the second extended electrode 15b, and the second connection electrode 16b.

As illustrated in FIG. 3, similarly to the first excitation electrode 14a, the first extended electrode 15a includes an underlying layer 51a and a surface layer 52a, and the first connection electrode 16a includes an underlying layer 61a and a surface layer 62a. The underlying layers 51a and 61a of the first extended electrode 15a and the first connection electrode 16a are formed integrally with the underlying layer 41a of the first excitation electrode 14a with the same material. The surface layers 52a and 62a of the first extended electrode 15a and the first connection electrode 16a are formed integrally with the surface layer 42a of the first excitation electrode 14a with the same material. Similar to the first excitation electrode 14a, chromium oxide 53a is formed also on the surface of the first extended electrode 15a, and chromium derived from the underlying layer 51a diffuses in the surface layer 52a of the first extended electrode 15a. Chromium oxide 63a is formed also on the surface of the first connection electrode 16a, and chromium derived from the underlying layer 61a diffuses in the surface layer 62a of the first connection electrodes 16a.

Although not illustrated, the second extended electrode 15b and the second connection electrode 16b also have underlying layers and surface layers similarly to the second excitation electrode 14b. Chromium oxides are formed on the surfaces of the second extended electrode 15b and the second connection electrode 16b.

By trimming a part of the surface layer 42a of the first excitation electrode 14a, at least a part of the first excitation electrode 14a may be thinner than the first extended electrode 15a. To be specific, the surface layer 42a of the first excitation electrode 14a in a central portion of the excitation portion 17 may be thinner than the surface layer 52a of the first extended electrode 15a on the peripheral portion 18. As an example, more chromium oxide is formed on the surfaces of the first extended electrode 15a and the first connection electrode 16a than on the surface of the first excitation electrode 14a.

The lid member 20 has a recess shape, in particular, a recess shape opening toward a main surface 32A of the base member 30. The lid member 20 is joined to the base member 30 and forms an internal space 26 in which the quartz crystal resonator 10 is accommodated between the lid member 20 and the base member 30. The shape of the lid member 20 is not particularly limited as long as the quartz crystal resonator 10 can be accommodated therein. As an example, the lid member 20 has a rectangular shape when seen in a plan view from the normal direction of the main surface of the top surface portion 21. The lid member 20 has, for example, long sides parallel to the first direction D1, short sides parallel to the second direction D2, and a height parallel to the third direction D3. Although a material of the lid member 20 is not particularly limited, the lid member 20 is made of a conductive material such as metal, for example. Since the lid member 20 is made of the conductive material, the lid member 20 has an electromagnetic shielding function of reducing input and output of electromagnetic waves into and from the internal space 26.

As illustrated in FIG. 2, the lid member 20 has an inner surface 24 and an outer surface 25. The inner surface 24 is a surface on the internal space 26 side, and the outer surface 25 is a surface on the side opposite to the inner surface 24. The lid member 20 includes the flat plate-shaped top surface portion 21 and a side wall portion 22 connected to the outer edge of the top surface portion 21 and extending in the direction intersecting with the main surface of the top surface portion 21. In addition, the lid member 20 has a facing surface 23 facing the base member 30 at a recessed opening end portion (an end portion of the side wall portion 22 on the side close to the base member 30). The facing surface 23 extends in a frame shape so as to surround the quartz crystal resonator 10.

The base member 30 holds the quartz crystal resonator 10 in an excitable manner. The base member 30 has a flat plate shape and has long sides parallel to the first direction D1, short sides parallel to the second direction D2, and a thickness parallel to the third direction D3. The base member 30 has a base body 31. The base body 31 has the main surface 32A (surface) and a main surface 32B (back surface) facing each other. The base body 31 is made of a sintered material such as insulating ceramic (alumina), for example. The base body 31 is preferably made of a heat-resistant material.

A pair of a first electrode pad 33a and a second electrode pad 33b is provided on the main surface 32A of the base member 30. A first external electrode 35a, a second external electrode 35b, a third external electrode 35c, and a fourth external electrode 35d are provided on the main surface 32B of the base member 30. The first electrode pad 33a and the second electrode pad 33b are terminals for electrically connecting the base member 30 and the quartz crystal resonator 10. The first external electrode 35a and the second external electrode 35b are terminals for electrically connecting an external circuit substrate (not illustrated) and the quartz crystal resonator unit 1. The third external electrode 35c and the fourth external electrode 35d are dummy electrodes to/from which an electric signal or the like is not input/output. Alternatively, they may be ground electrodes that ground the lid member 20 to improve the electromagnetic shielding function of the lid member 20. The third external electrode 35c and the fourth external electrode 35d may be omitted.

The first electrode pad 33a and the second electrode pad 33b are aligned along the second direction D2. The first external electrode 35a and the fourth external electrode 35d are aligned along the first direction D1. The second external electrode 35b and the third external electrode 35c are aligned along the first direction D1. The first electrode pad 33a is electrically connected to the first external electrode 35a with a first via electrode 34a extending in the third direction D3 interposed therebetween. The second electrode pad 33b is electrically connected to the second external electrode 35b with a second via electrode 34b extending in the third direction D3 interposed therebetween. The first via electrode 34a and the second via electrode 34b are formed in via holes penetrating through the base body 31 in the third direction D3.

A pair of a first conductive holding member 36a and a second conductive holding member 36b is provided on the main surface 32A side of the base member 30. To be specific, the first conductive holding member 36a is provided on the first electrode pad 33a, and the second conductive holding member 36b is provided on the second electrode pad 33b. The first conductive holding member 36a and the second conductive holding member 36b mount the quartz crystal resonator 10 on the base member 30 and electrically connect the quartz crystal resonator 10 and the base member 30. The first conductive holding member 36a is joined to the first connection electrode 16a of the quartz crystal resonator 10 and electrically connects the first electrode pad 33a and the first connection electrode 16a. The second conductive holding member 36b is joined to the second connection electrode 16b of the quartz crystal resonator 10 and electrically connects the second electrode pad 33b and the second connection electrode 16b. The first conductive holding member 36a and the second conductive holding member 36b hold the quartz crystal resonator 10 at a distance from the base member 30 such that the excitation portion 17 can be excited. The first conductive holding member 36a and the second conductive holding member 36b are, for example, conductive adhesives containing thermosetting resin, ultraviolet curable resin, or the like containing silicone-based resin as a main agent and contain an additive such as conductive particles for imparting conductivity to the adhesives. As the conductive particles, for example, conductive particles containing silver (Ag) are used. Alternatively, the main agent of the conductive adhesives may be epoxy-based resin. The first conductive holding member 36a and the second conductive holding member 36b are provided by applying uncured conductive adhesive pastes as a precursor, and then, curing the conductive adhesive pastes by chemical reaction caused by heating, ultraviolet irradiation, or the like. Further, a filler may be added to the adhesives for the purpose of increasing the strength or keeping the distance between the base member 30 and the quartz crystal resonator 10. The first conductive holding member 36a and the second conductive holding member 36b may be provided by soldering.

The joining member 40 is provided over the entire circumference of each of the lid member 20 and the base member 30. To be specific, the joining member 40 has a rectangular frame shape when the main surface 32A is seen in a plan view. In addition, the first electrode pad 33a and the second electrode pad 33b are arranged on the inner side of the joining member 40, and the joining member 40 is provided so as to surround the quartz crystal resonator element 10. The joining member 40 is interposed between the facing surface 23 of the side wall portion 22 of the lid member 20 and the first main surface 32A of the base member 30. The joining member 40 is provided by, for example, a resin-based adhesive. The joining member 40 may be provided by a glass-based adhesive, Au—Sn alloy-based metal solder, or the like. When the joining member 40 is provided by the metal solder, a metallized layer may be provided on the base member 30 from the viewpoint of improving adhesion to the joining member 40. In the embodiment, the joining member 40 is provided in the frame shape continuous in the circumferential direction but may be provided discontinuously in the circumferential direction.

Figure 4:
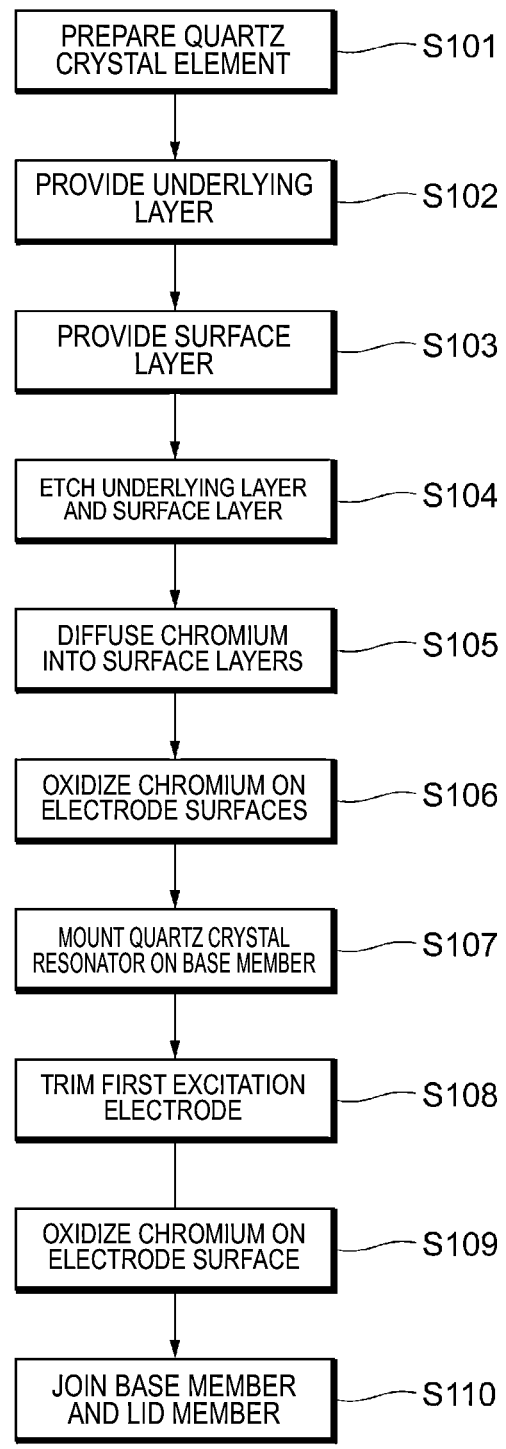
FIG. 4 is a flowchart schematically illustrating a part of a method of manufacturing the quartz crystal resonator in the first embodiment.
Figure 5:
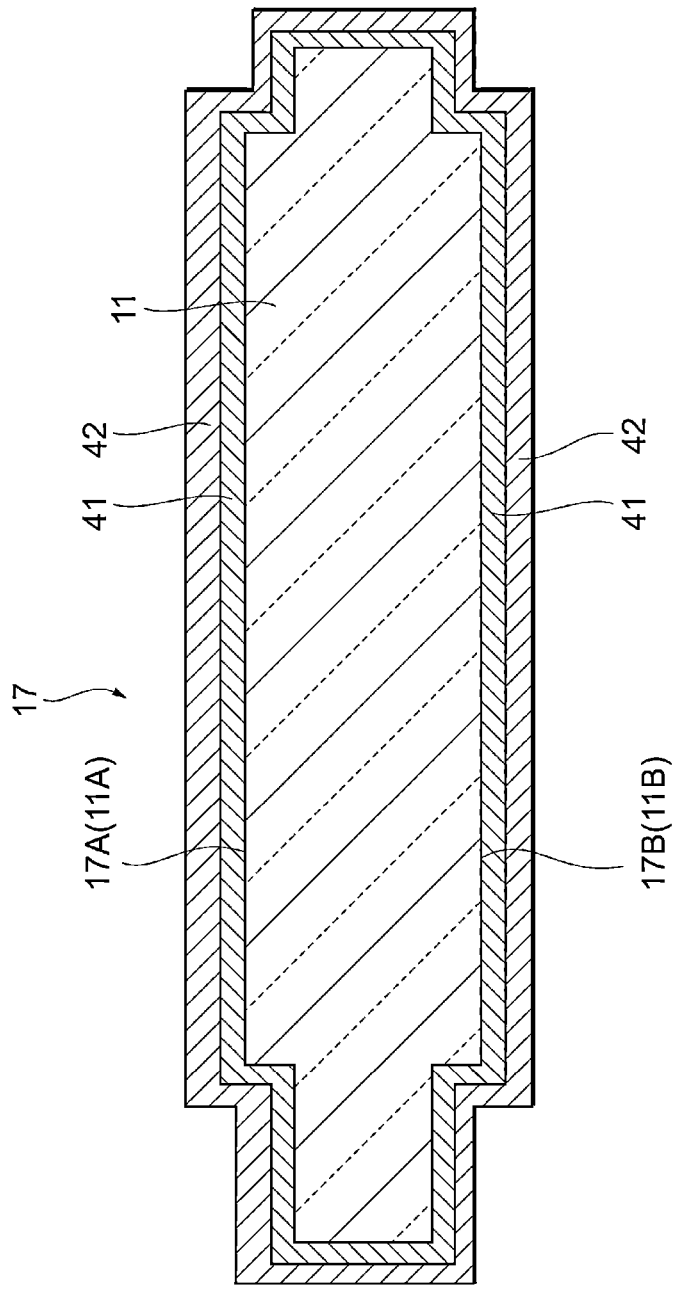
FIG. 5 is a cross-sectional view schematically illustrating a step of forming an underlying layer and a surface layer on a quartz crystal element.
Figure 6:
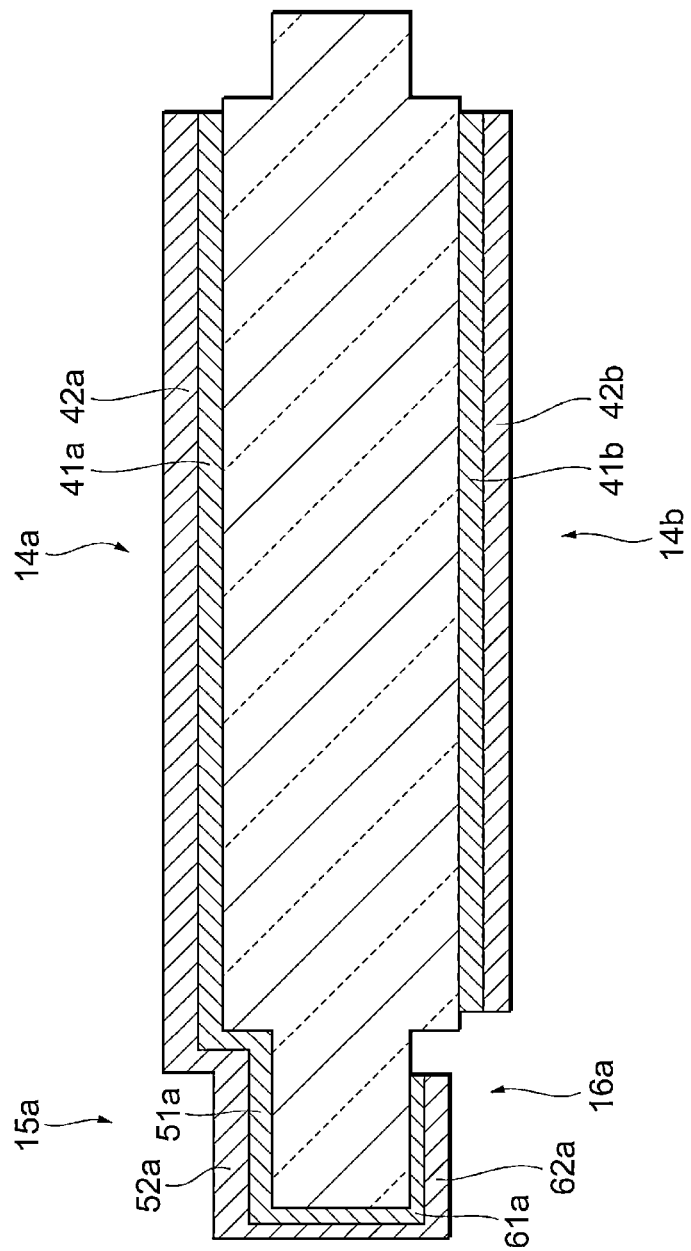
FIG. 6 is a cross-sectional view schematically illustrating a step of patterning electrodes.
Figure 7:
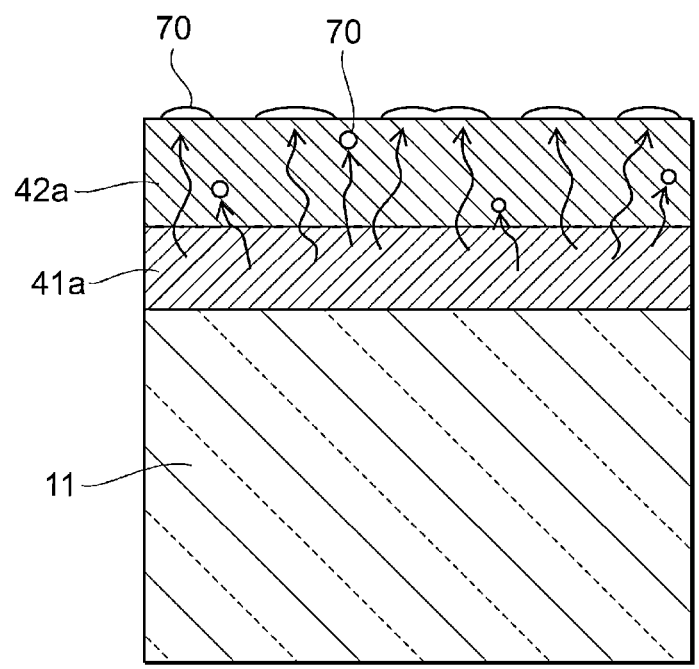
FIG. 7 is a cross-sectional view schematically illustrating a chromium diffusion step.
Figure 8:
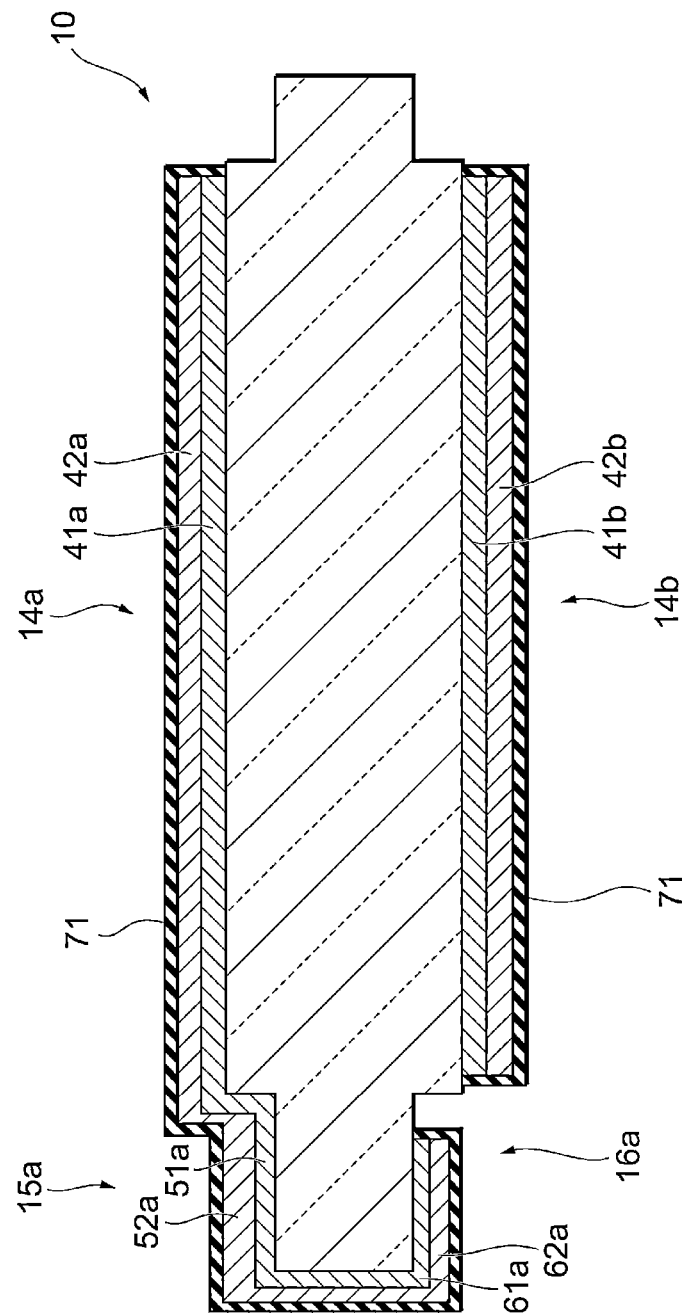
FIG. 8 is a cross-sectional view schematically illustrating an oxidizing step of oxidizing chromium on electrode surfaces.
Figure 9:
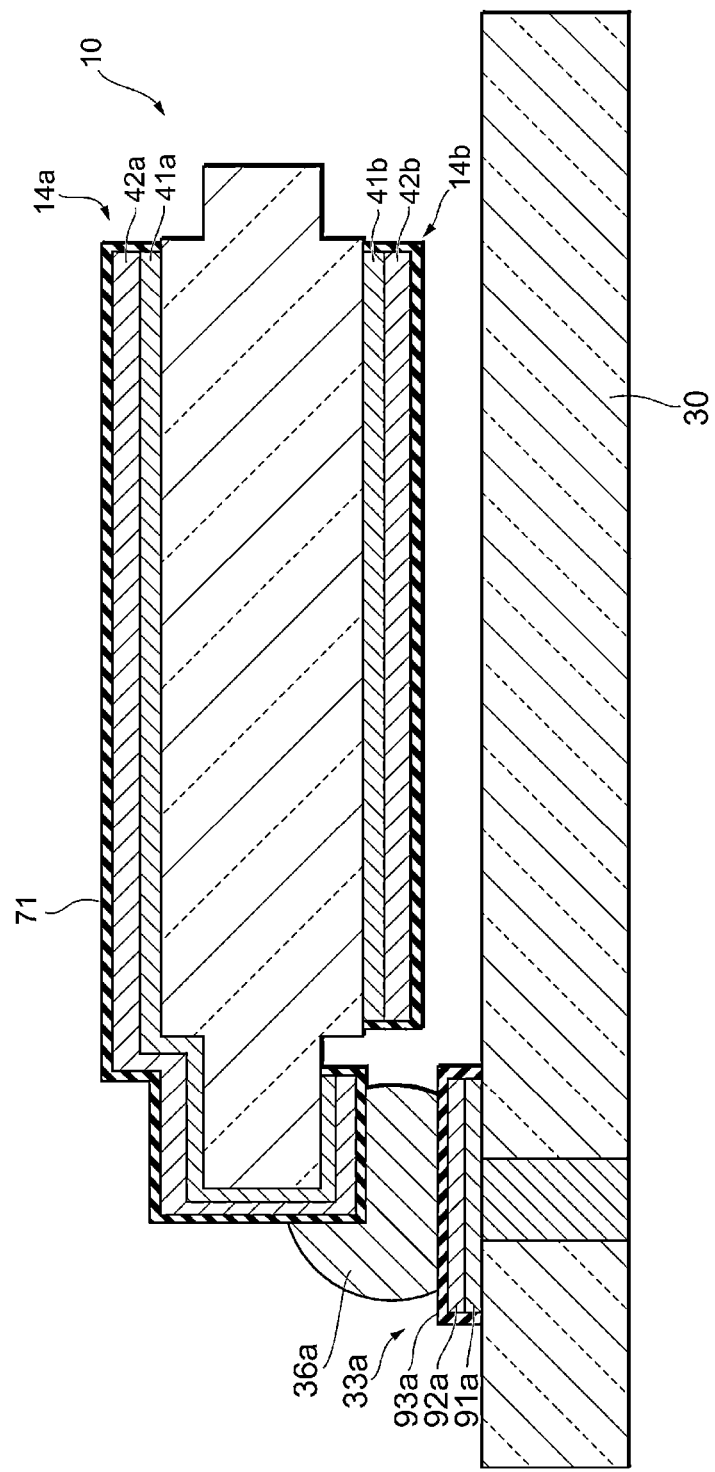
FIG. 9 is a cross-sectional view schematically illustrating a mounting step of mounting the quartz crystal resonator on a base member.
Figure 10:
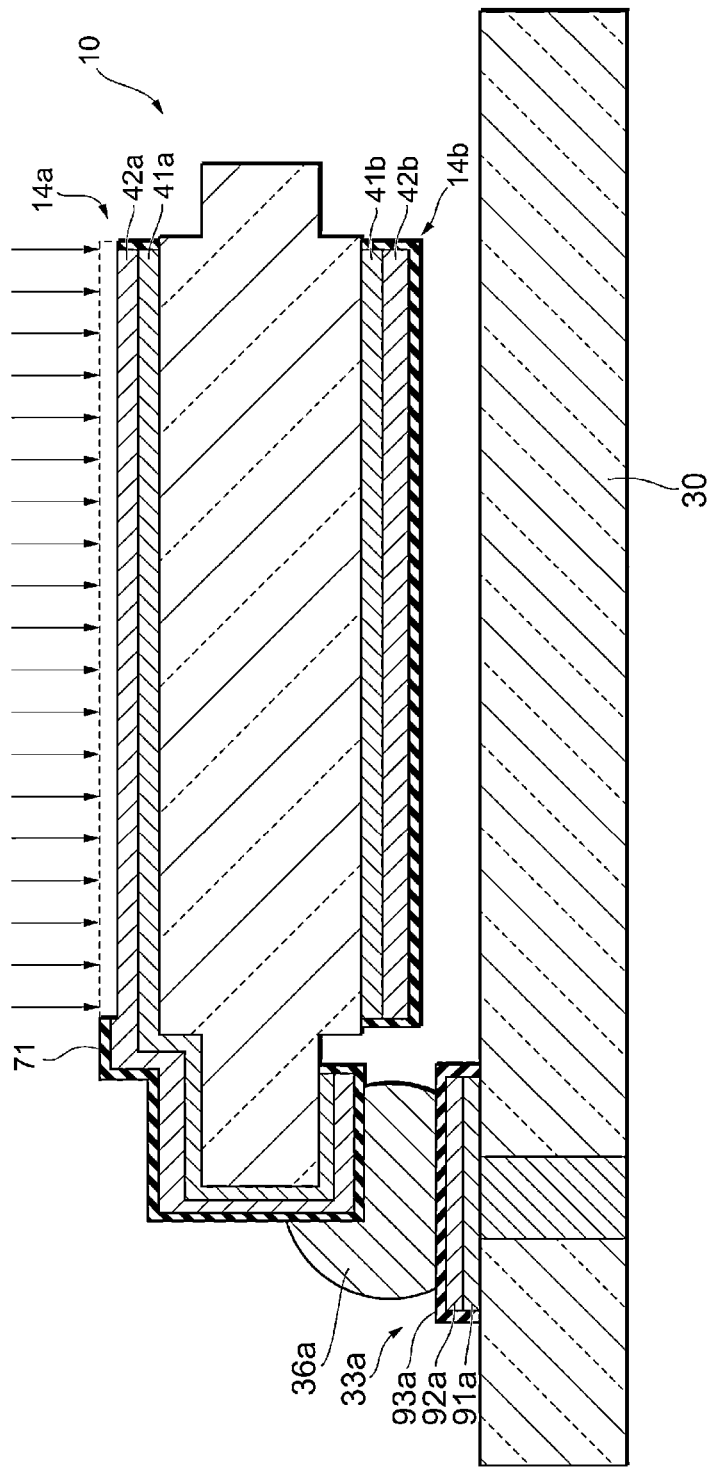
FIG. 10 is a cross-sectional view schematically illustrating a frequency-adjusting step of trimming a second excitation electrode.
Figure 11:
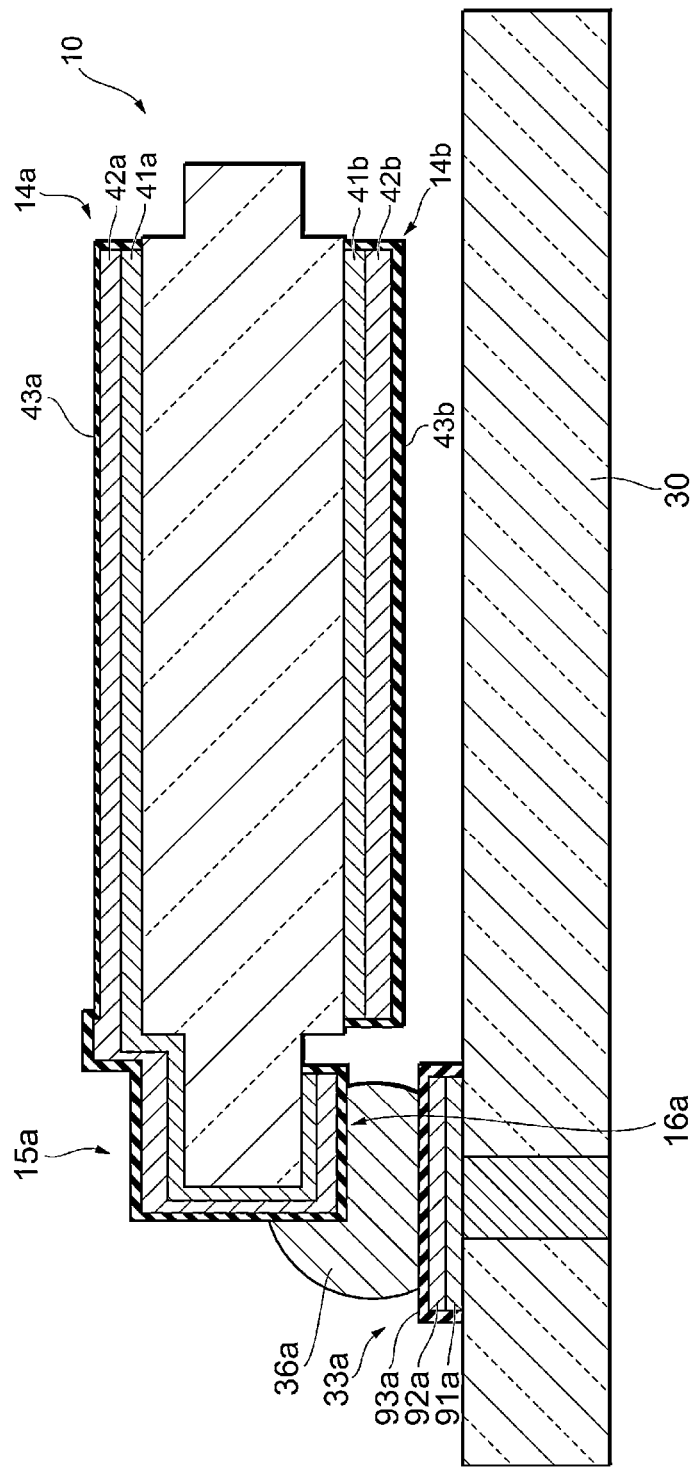
FIG. 11 is a cross-sectional view schematically illustrating an oxidizing step of oxidizing chromium exposed on the surfaces of excitation electrodes.
Figure 12:
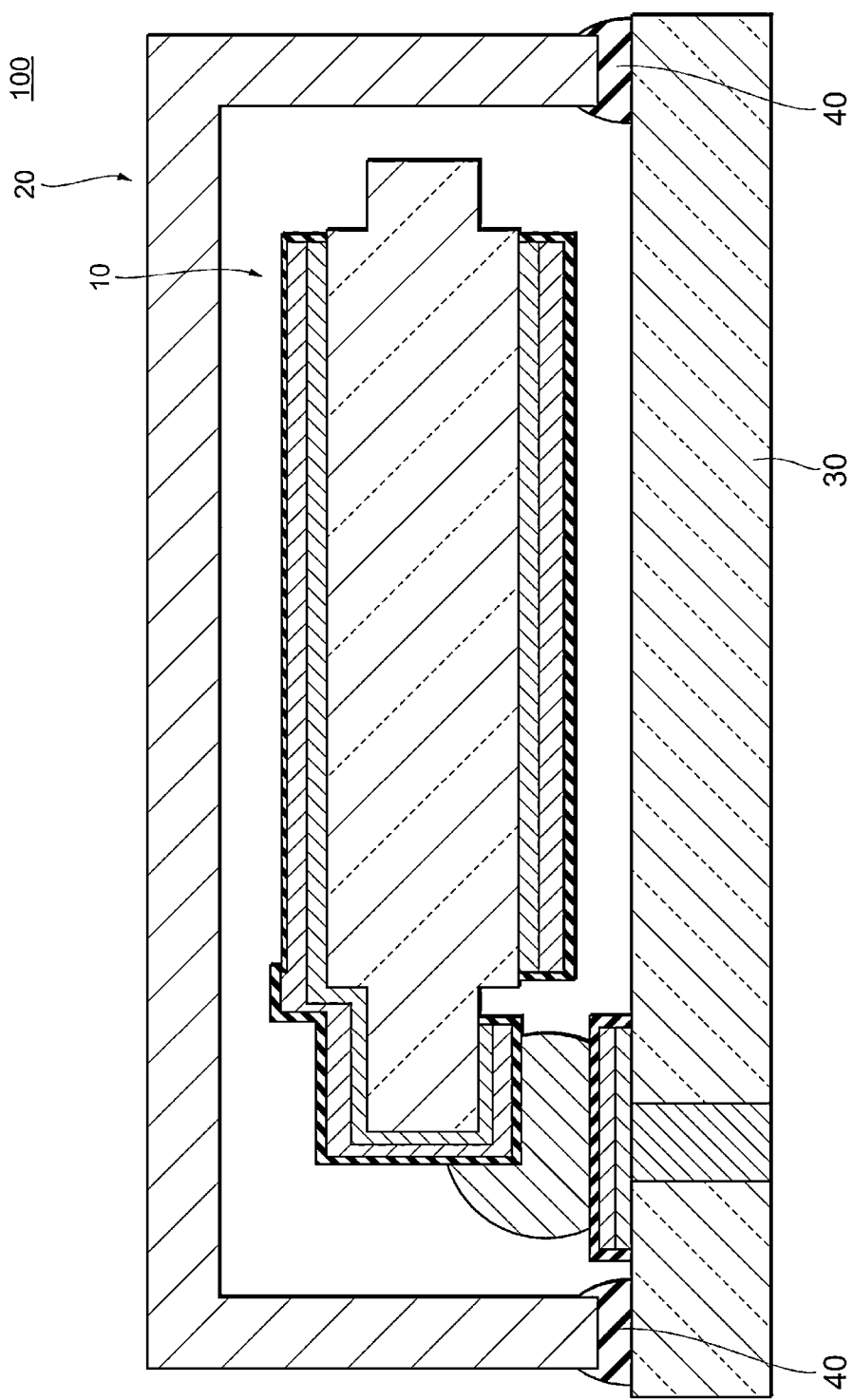
FIG. 12 is a cross-sectional view schematically illustrating a joining step of joining a lid member to the base member.

Next, an example of a method of manufacturing the quartz crystal resonator unit 1 in the first embodiment will be described with reference to FIG. 4 to FIG. 12. FIG. 4 is a flowchart schematically illustrating a part of the method of manufacturing the quartz crystal resonator unit in the first embodiment. FIG. 5 to FIG. 12 are views for explaining the method of manufacturing the quartz crystal resonator unit. Specifically, FIG. 5 is a cross-sectional view schematically illustrating a step of forming the underlying layer and the surface layer on the quartz crystal element. FIG. 6 is a cross-sectional view schematically illustrating a step of patterning electrodes. FIG. 7 is a cross-sectional view schematically illustrating a chromium diffusion step. FIG. 8 is a cross-sectional view schematically illustrating an oxidizing step of oxidizing chromium on electrode surfaces. FIG. 9 is a cross-sectional view schematically illustrating a mounting step of mounting the quartz crystal resonator on the base member. FIG. 10 is a cross-sectional view schematically illustrating a frequency-adjusting step of trimming the second excitation electrode. FIG. 11 is a cross-sectional view schematically illustrating an oxidizing step of oxidizing chromium exposed to the surfaces of the excitation electrodes. FIG. 12 is a cross-sectional view schematically illustrating a joining step of joining the lid member to the base member.

First, a quartz crystal element is prepared (S101).

In this step, a quartz crystal substrate is cut out from a single crystal of a synthetic quartz crystal such that the XZ' plane becomes a main surface, and a part of the quartz crystal substrate is removed by wet etching using a photolithography method to form the contour of the quartz crystal element 11 when the XZ' plane is seen in a plan view. Subsequently, portions of the quartz crystal element 11, which correspond to the peripheral portions 18 and 19, are partially removed by wet etching to form the double-sided mesa structure.

Then, an electrode forming step of providing electrodes on the quartz crystal element 11 is performed.

In the embodiment, the term "electrodes" is used as a general term for various electrodes provided in the quartz crystal resonator, and specifically refers to the first and second excitation electrodes, the first and second extended electrodes, and the first and second connection electrodes. In the electrode forming step, first, an underlying layer is provided (S102), and then, a surface layer is provided (S103). Thereafter, the underlying layer and the surface layer are etched (S104).

As illustrated in FIG. 5, an underlying layer 41 is provided so as to surround the quartz crystal element 11 by depositing a metal material containing Cr on the surface of the quartz crystal element 11 by sputtering, for example. The underlying layer 41 is formed to have the thickness of, for example, 1 nm to 20 nm. By setting the thickness thereof to be equal to or more than 1 nm, it is possible to suppress lowering of adhesion to the quartz crystal element 11. In addition, by setting the thickness thereof to be equal to or less than 20 nm, it is possible to suppress deterioration in vibration characteristics over time.

As illustrated in FIG. 5, a surface layer 42 is provided so as to surround the underlying layer 41 by depositing a metal material containing Au on the surface of the underlying layer 41 by sputtering, for example. The surface layer 42 is formed to have the thickness of, for example, 1 nm to 500 nm. By setting the thickness thereof to be equal to or more than 1 nm, it is possible to suppress oxidation of the underlying layer 41. In addition, by setting the thickness thereof to be equal to or less than 500 nm, it is possible to suppress the usage amount of Au and reduce time required for film formation of the surface layer 42. The surface layer 42 on the surface 11A side of the quartz crystal element 11 may be formed to be thicker than the surface layer 42 on the back surface 11B side so as not to cause the underlying layer 41 to be exposed due to complete removal of the surface layer 42 on the main surface 17A side in the frequency-adjusting step, which will be described later.

The film forming method of the underlying layer 41 and the surface layer 42 is not limited to sputtering and may be appropriately selected from various vapor deposition methods such as physical vapor deposition (PVD) and chemical vapor deposition (CVD). The underlying layer 41 and the surface layer 42 may be formed by a film forming method other than the vapor phase growth method, such as a printing method or a plating method.

As illustrated in FIG. 6, the outer shapes of the electrodes are formed by step S104 of etching the underlying layer 41 and the surface layer 42. To be specific, the underlying layer 41 and the surface layer 42 other than portions corresponding to the first and second excitation electrodes 14a and 14b, the first and second extended electrodes 15a and 15b, and the first and second connection electrodes 16a and 16b are removed by wet etching using the photolithography method.

The electrode forming step is not limited to the above-described step, and the electrodes may be formed by, for example, so-called lift-off in which the underlying layer and the surface layer are formed on a patterned photoresist and unnecessary portions are removed together with the photoresist.

Thereafter, chromium is diffused into the surface layers (S105).

This step S105 is an electrode diffusion step of diffusing chromium into the surface layers of the electrodes and corresponds to an excitation electrode diffusion step, an extended electrode diffusion step, and a connection electrode diffusion step. Taking the first excitation electrode 14a illustrated in FIG. 7 as an example, chromium 70 contained in the underlying layer 41a diffuses into the surface layer 42a. The chromium 70 that has reached the surface layer 42a on the opposite side to the underlying layer 41a is deposited on the surface of the surface layer 42a. The diffusion is allowed to proceed until the amount of chromium 70 on the surface of the surface layer 42a exceeds the amount of chromium 70 in the surface layer 42a. The amount of chromium 70 on the surface of the surface layer 42a and the amount thereof in the surface layer 42a are compared in terms of, for example, the amount of chromium 70 per unit area or the amount of chromium 70 per unit volume in a cross-sectional view as illustrated in FIG. 7. Simultaneously with the diffusion of the chromium 70 in the first excitation electrode 14a, chromium diffuses also in the second excitation electrode 14b, the first and second extended electrodes 15a and 15b, and the first and second connection electrodes 16a and 16b. The diffusion of the chromium 70 is promoted by heating in vacuum or in an inert gas atmosphere, for example.

Then, the chromium on the electrode surfaces is oxidized (S106).

This step S106 corresponds to a first oxidizing step and a second oxidizing step. As illustrated in FIG. 8, the chromium 70 exposed to the surfaces of the first and second excitation electrodes 14a and 14b, the first and second extended electrodes 15a and 15b, and the first and second connection electrodes 16a and 16b is heated in an oxygen atmosphere to form chromium oxide 71. The chromium oxide 71 is desirably $Cr_2O_3$ but may contain CrO at this stage.

Subsequently, the quartz crystal resonator is mounted on the base member (S107).

This step S107 corresponds to a mounting step. For example, the first and second conductive holding members 36a and 36b that are uncured are applied onto the first and second electrode pads 33a and 33b of the base member 30, the quartz crystal resonator 10 is placed on the uncured first and second conductive holding members 36a and 36b, and the first and second conductive holding members 36a and 36b are cured. When the first and second conductive holding members 36a and 36b are made of thermosetting resin, chromium exposed onto the surfaces of the first and second excitation electrodes 14a and 14b may be oxidized by heating when the first and second conductive holding members 36a and 36b are cured. Since the chromium oxide 71 formed on the surfaces of the first and second connection electrodes 16a and 16b is sufficiently thin, the electrical connection between the quartz crystal resonator 10 and the base member 30 is not disturbed.

Before the mounting step S107, a step of providing the base member 30 is performed. As illustrated in FIG. 9, when the electrode pad 33a has an underlying layer 91a containing chromium and a surface layer 92a containing gold, a pad forming step of providing the electrode pad 33a may include a step of providing the underlying layer 91a, a step of providing the surface layer 92a, a step of diffusing chromium into the surface layer 92a, and a step of oxidizing chromium exposed onto the surface layer 92a. With this, chromium oxide 93a is formed on the surface of the surface layer 92a of the electrode pad 33a. Since the chromium oxide 93a formed on the surface of the electrode pad 33a is sufficiently thin, the electrical connection between the quartz crystal resonator 10 and the base member 30 is not disturbed.

Thereafter, the first excitation electrode is trimmed (S108).

This step S108 corresponds to a frequency-adjusting step. Removal of a part of the first excitation electrode 14a (a part of the surface layer 42a) changes the mass of the excitation portion 17 to adjust the resonance frequency of the quartz crystal resonator 10. In this case, the chromium oxide 71 formed on the surface of the first excitation electrode 14a is also removed. On the surface of the surface layer 42a after trimming, less chromium than that on the surface of the surface layer 42a before trimming is exposed. This is because, as described above, the amount of chromium in the surface layer 42a is smaller than that on the surface thereof. The trimming is performed by, for example, dry etching in which an argon (Ar) ion beam is emitted. Since the ion beam can be emitted over a wide range, processing efficiency is excellent.

Then, chromium on the electrode surface is oxidized (S109).

This step S109 corresponds to an oxidizing step. Chromium exposed onto the surface of the surface layer 42a of the first excitation electrode 14a is oxidized. This step S109 corresponds to a step of forming chromium oxide on the surface of the surface layer 42a of the first excitation electrode 14a. Since the amount of chromium exposed onto the surface of the trimmed first excitation electrode 14a is smaller than the amount of chromium exposed on the surface of the untrimmed second excitation electrodes 14b, a smaller amount of chromium oxide 43a than the chromium oxide 43b formed on the surface of the second excitation electrode 14b is formed on the surface of the first excitation electrode 14a. In this case, it is desirable that the chromium oxide 43a formed on the surface of the first excitation electrode 14a is $Cr_2O_3$. When Cr or CrO remains on the surfaces of the second excitation electrode 14b, the first connection electrode 16a, and the second connection electrode 16b, it is desirable that it is changed to $Cr_2O_3$ at this step S109.

The main oxidizing step at S109 may be carried out under the same oxidizing conditions such as heating temperature and heating time as those of the oxidizing step at S106 performed before the main oxidizing step. Alternatively, the oxidizing step at S109 may be carried out under different oxidizing conditions from those of the oxidizing step at S106 so as to promote the oxidization in comparison with the oxidizing step at S106. For example, the oxidizing step at S109 may be carried out at a higher heating temperature or for a longer heating time than that in the oxidizing step at S106.

Subsequently, the base member and the lid member are joined together (S110).

This step S110 corresponds to a joining step. For example, the uncured joining member 40 is attached to the opening end portion of the lid member 20, and the joining member 40 that is uncured is cured in a state of being interposed between the lid member 20 and the base member 30.

The method of manufacturing the quartz crystal resonator 10 is not limited to the above-described method. For example, the diffusion step S105 may be performed before the step S104 of etching the underlying layer and the surface layer, and the oxidizing step S106 may be performed before the step S104 of etching the underlying layer and the surface layer. The diffusion step S105 and the oxidizing step S106 may be performed between the mounting step S107 and the frequency-adjusting step S108. The oxidizing step S106 may be omitted.

As described above, in the quartz crystal resonator unit 1 and the method of manufacturing the same in the embodiment, more chromium oxide is formed on the surface of the surface layer 42b of the second excitation electrode 14b than on the surface of the surface layer 42a of the first excitation electrode 14a. With this configuration, since an organic substance is less likely to be adsorbed to the chromium oxide surface than to the metallic surface, deposition of the organic substance evaporated from the first and second conductive holding members 36a and 36b onto the first and second excitation electrodes 14a and 14b can be suppressed. In other words, the antifouling property of the first and second excitation electrodes 14a and 14b is improved. Therefore, change in the masses of the first and second excitation electrodes 14a and 14b can be suppressed, and change in the resonance frequency of the quartz crystal resonator unit 1 over time can be reduced. Accordingly, the reliability of the quartz crystal resonator unit 1 is improved. In particular, when the first and second conductive holding members 36a and 36b are contamination sources, the antifouling property of the second excitation electrode 14b closer to the contamination source than the first excitation electrode 14a becomes higher than the antifouling property of the first excitation electrode 14a. The change in the resonance frequency of the quartz crystal resonator unit 1 over time can thereby be reduced more effectively.

Hereinafter, the configuration of a quartz crystal resonator unit according to another embodiment of the invention will be described. In the following embodiment, description of matters common to those in the above-described first embodiment will be omitted, and only different points will be described. In particular, the same action effects by the same configurations will not be sequentially described.

Second Embodiment

Figure 13:
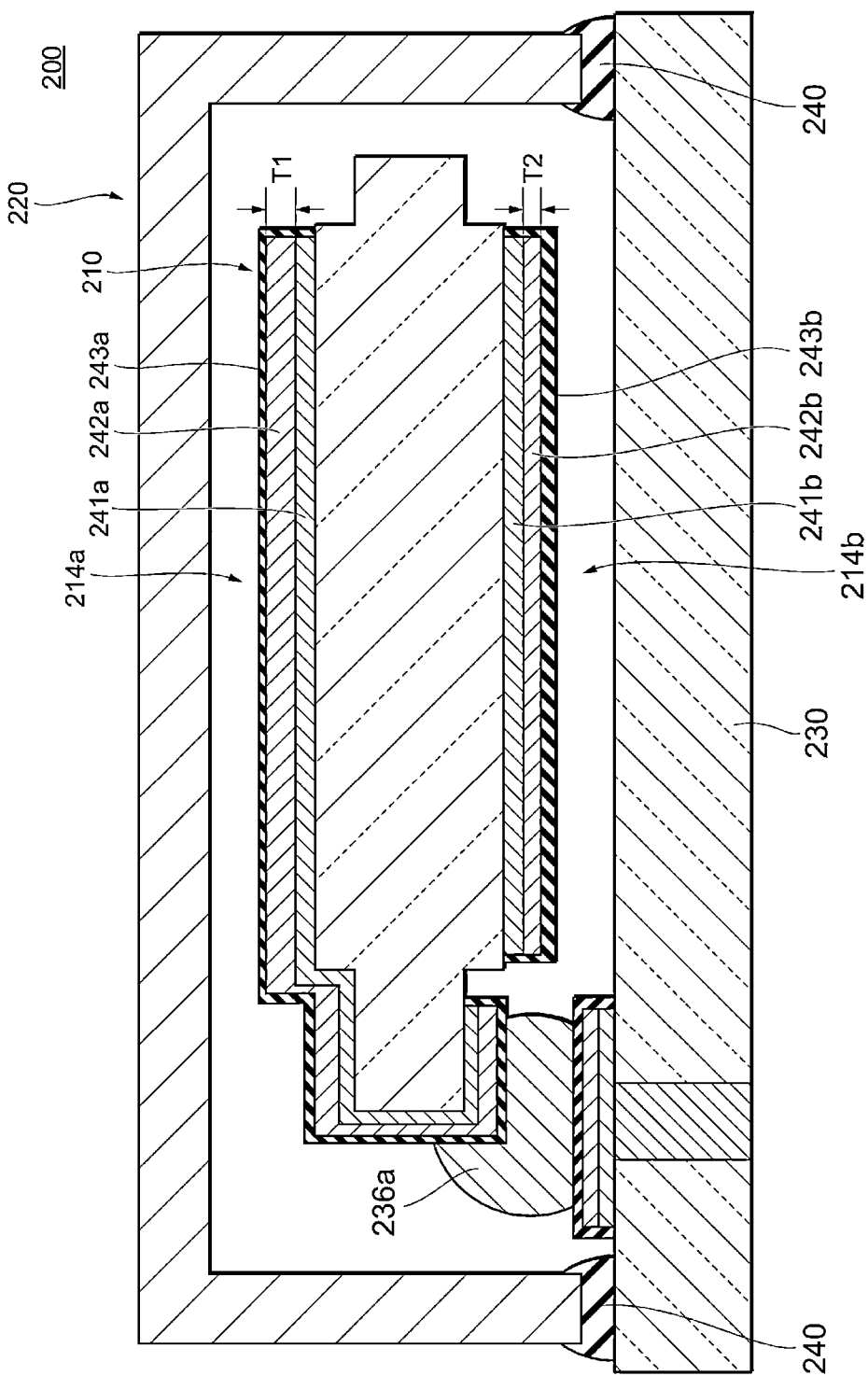
FIG. 13 is a cross-sectional view schematically illustrating the configuration of a quartz crystal resonator unit according to a second embodiment.

Next, the configuration of a quartz crystal resonator unit 200 according to a second embodiment will be described with reference to FIG. 13. FIG. 13 is a cross-sectional view schematically illustrating the configuration of the quartz crystal resonator unit in the second embodiment.

The quartz crystal resonator unit 200 in the second embodiment includes a quartz crystal resonator 210, a lid member 220, a base member 230, a first conductive holding member 236a, and a joining member 240, similarly to the quartz crystal resonator 1 in the first embodiment. The quartz crystal resonator 210 includes a first excitation electrode 214a and a second excitation electrode 214b. The first excitation electrode 214a includes an underlying layer 241a and a surface layer 242a, and chromium oxide 243a is formed on the surface of the first excitation electrode 214a. The second excitation electrode 214b includes an underlying layer 241b and a surface layer 242b, and a larger amount of chromium oxide 243b is formed on the surface of the second excitation electrode 214b than that on the first excitation electrode 214a.

The second embodiment is different from the first embodiment in that a surface layer thicker than that of the second excitation electrode 214b is formed in the first excitation electrode 214a in a step of providing the surface layer. To be specific, a thickness T1 of the surface layer 242a of the first excitation electrode 214a is larger than a thickness T2 of the surface layer 242b of the second excitation electrode 214b. In other words, in a mounting step in a method of manufacturing the quartz crystal resonator unit 200 in the embodiment, the quartz crystal resonator 210 is mounted with such orientation that the excitation electrode 214b including the thinner surface layer 242b is arranged on the base member 230 side. With this configuration, a diffusion path of chromium in the first excitation electrode 214a becomes longer than a diffusion path of chromium in the second excitation electrode 214b. Therefore, in a diffusion step, more chromium is deposited on the surface of the surface layer 242b of the second excitation electrode 214b than on the surface of the surface layer 242a of the first excitation electrode 214a. Accordingly, the larger amount of chromium oxide 243b can be formed than that of chromium oxide 243a even without forming a surface with a small amount of chromium that is exposed in the frequency-adjusting step on the first excitation electrode 214a.

Some or all of the embodiments of the invention will be described below. Note that the invention is not limited to the following configuration.

According to an aspect of the invention, there is provided a method of manufacturing a piezoelectric resonator unit, the method including mounting a piezoelectric resonator on a base member by a conductive holding member, the piezoelectric resonator including a piezoelectric element and a pair of excitation electrodes facing each other with the piezoelectric element interposed therebetween, each of the pair of excitation electrodes including an underlying layer containing chromium and a surface layer on the underlying layer; forming chromium oxide on the surface layer of each of the pair of excitation electrodes by oxidizing the chromium diffused from the underlying layer such that an amount of the chromium oxide is larger on the surface layer of the excitation electrode on a base member side than on the surface layer of the excitation electrode on a lid member side among the pair of excitation electrodes; and joining a lid member to the base member such that the piezoelectric resonator is located between the base member and the lid member.

With this configuration, since the organic substance is less likely to be adsorbed to the chromium oxide surface than to the metal surface, deposition of the organic substance evaporated from the conductive holding member onto the pair of excitation electrodes can be suppressed. In other words, the antifouling property of the pair of excitation electrodes is improved. Therefore, change in the masses of the pair of excitation electrodes can be suppressed, and change in the resonance frequency of the piezoelectric resonator unit over time can be reduced. In addition, it is possible to suppress deposition of the chromium on the surfaces of the pair of excitation electrodes and the change in the resonance frequency due to oxidation of the deposited chromium over time. Accordingly, the reliability of the piezoelectric resonator unit is improved. In particular, when the conductive holding member is a contamination source, the antifouling property of the excitation electrode on the base member side close to the contamination source becomes higher than the antifouling property of the excitation electrode on the lid member side. The change in the resonance frequency of the piezoelectric resonator unit over time can thereby be reduced more effectively.

In one aspect, the chromium oxide is $Cr_2O_3$.

With this configuration, it is possible to suppress change in the masses of the pair of excitation electrodes due to chemical change from $CrO$ to $Cr_2O_3$.

In one aspect, the providing the lid member the lid member is joined to the base member by a joining member.

In one aspect, the lid member is joined to the base member after the chromium oxide is formed.

With this configuration, even if the joining member existing in a larger amount than the conductive holding member becomes a contamination source, it is possible to suppress change in the masses of the excitation electrodes, in particular, change in the mass of the second excitation electrode.

In one aspect, the method further includes trimming the excitation electrode on the lid member side to perform frequency adjustment of the piezoelectric resonator after mounting the piezoelectric resonator on the base member.

In one aspect, the chromium oxide is formed after the frequency adjustment of the piezoelectric resonator is performed.

In one aspect, the frequency adjustment of the piezoelectric resonator is performed after the chromium is diffused.

With this configuration, trimming enables a surface having less chromium than that before trimming to be formed on the surface layer of the excitation electrode on the lid member side.

In one aspect, the method of manufacturing the piezoelectric resonator unit further includes an initial oxidizing of the chromium diffused from the underlying layers to the surface layers after the chromium is diffused and before the frequency adjustment of the piezoelectric resonator is performed, and the forming of the chromium oxide on the surface layer of each of the pair of excitation electrodes is performed after the frequency adjustment of the piezoelectric resonator.

In one aspect, the forming of the piezoelectric resonator includes forming the surface layer of the excitation electrode on the base member side to be thicker than the surface layer of the excitation electrode on the lid member side.

With this configuration, the length of a diffusion path of the chromium to the surface of the surface layer of the excitation electrode on the lid member side is longer than the length of a diffusion path of the chromium to the surface of the surface layer of the excitation electrode on the base member side. Accordingly, even if the excitation electrode on the lid member side is not trimmed, more chromium oxide can be formed on the surface of the excitation electrode on the base member side than that on the surface of the excitation electrode on the lid member side.

In one aspect, the piezoelectric resonator further includes a pair of connection electrodes on the piezoelectric element, each of the pair of connection electrodes includes an underlying layer containing chromium and a surface layer, and the method further includes oxidizing the chromium diffused from the underlying layer to the surface layer in each of the pair of connection electrodes.

In one aspect, the base member has a flat plate shape, and the lid member has a recess shape having an opening accommodating the piezoelectric resonator.

With this configuration, since the joining member is arranged closer to the excitation electrode on the base member side than to the excitation electrode on the lid member side, the excitation electrode on the base member side is in an environment more likely to be contaminated than the excitation electrode on the lid member side. However, change in the mass of the excitation electrode on the base member side can be suppressed.

In one aspect, the piezoelectric resonator is a quartz crystal resonator.

According to another aspect of the present invention, there is provided a piezoelectric resonator unit including a base member, a piezoelectric resonator having a piezoelectric element and a first excitation electrode and a second excitation electrode facing each other with the piezoelectric element interposed therebetween, the second excitation electrode facing the base member, a first conductive holding member and a second conductive holding member that mount the piezoelectric resonator on the base member and are respectively electrically connected to the first excitation electrode and the second excitation electrode, and a lid member joined to the base member such that the piezoelectric resonator is located between the lid member and the base member, in which each of the first excitation electrode and the second excitation electrode includes an underlying layer containing chromium as a main component thereof and a surface layer containing gold as a main component thereof, wherein an amount of the chromium diffused onto a surface of the surface layer is larger in the second excitation electrode than in the first excitation electrode, and $Cr_2O_3$ is on at least a part of the surface of the surface layer in the first excitation electrode and the second excitation electrode.

In one aspect, a thickness of at least a part of the first excitation electrode is smaller than a thickness of the second excitation electrode.

In one aspect, a larger amount of the $Cr_2O_3$ is on the surface of the surface layer of the second excitation electrode than on the surface of the surface layer of the first excitation electrode.

In one aspect, the base member has a flat plate shape, and the lid member has a recess shape having an opening accommodating the piezoelectric resonator.

In one aspect, the piezoelectric resonator unit further includes an extended electrode that electrically connects the first excitation electrode and the first connection electrode, and a thickness of at least a part of the first excitation electrode is smaller than a thickness of the extended electrode.

In one aspect, a thickness of the surface layer of the first excitation electrode is larger than a thickness of the surface layer of the second excitation electrode.

As described above, according to one aspect of the invention, it is possible to provide a piezoelectric resonator unit with improved reliability and a method of manufacturing the same.

The embodiments described above are intended to facilitate understanding of the present invention and are not intended to limit the interpretation of the invention. The invention can be modified/improved without departing from the spirit thereof, and the invention includes equivalents thereof. That is, the embodiments to which a person skilled in the art adds appropriate design changes are also included in the scope of the invention as long as they have the features of the invention. For example, components included in each of the embodiments and the arrangement, materials, conditions, shapes, sizes, and the like thereof are not limited to those exemplified and can be appropriately changed. In addition, the components included in each of the embodiments can be combined in a technically possible range, and combinations of these components are also included in the scope of the invention as long as they have the features of the invention.

REFERENCE SIGNS LIST

1 QUARTZ CRYSTAL RESONATOR UNIT
10 QUARTZ CRYSTAL RESONATOR
11 QUARTZ CRYSTAL ELEMENT
11A SURFACE
11B BACK SURFACE
14*a* FIRST EXCITATION ELECTRODE
14*b* SECOND EXCITATION ELECTRODE
15*a* FIRST EXTENDED ELECTRODE
15*b* SECOND EXTENDED ELECTRODE
16*a* FIRST CONNECTION ELECTRODE
16*b* SECOND CONNECTION ELECTRODE
17 EXCITATION PORTION
17A, 17B MAIN SURFACE
18, 19 PERIPHERAL PORTION
18A, 18B MAIN SURFACE

20 LID MEMBER
30 BASE MEMBER
36a FIRST CONDUCTIVE HOLDING MEMBER
36b SECOND CONDUCTIVE HOLDING MEMBER
40 JOINING MEMBER
41a, 41b, 51a, 61a UNDERLYING LAYER
42a, 42b, 52a, 62a SURFACE LAYER
43a, 43b, 53a, 63a CHROMIUM OXIDE

The invention claimed is:

1. A piezoelectric resonator unit comprising:
a base member;
a piezoelectric resonator having a piezoelectric element and a first excitation electrode and a second excitation electrode facing each other with the piezoelectric element interposed therebetween, the second excitation electrode facing the base member;
a first conductive holding member and a second conductive holding member that mount the piezoelectric resonator on the base member and are respectively electrically connected to the first excitation electrode and the second excitation electrode; and
a lid member joined to the base member such that the piezoelectric resonator is located between the lid member and the base member,
wherein each of the first excitation electrode and the second excitation electrode include an underlying layer containing chromium as a main component thereof and a surface layer containing gold as a main component thereof,
wherein an amount of the chromium diffused onto a surface of the surface layer is larger in the second excitation electrode than in the first excitation electrode, and
$Cr_2O_3$ is on at least a part of the surface of the surface layer in the first excitation electrode and the second excitation electrode.

2. The piezoelectric resonator unit according to claim 1, wherein a thickness of at least a part of the first excitation electrode is smaller than a thickness of the second excitation electrode.

3. The piezoelectric resonator unit according to claim 1, wherein a larger amount of the $Cr_2O_3$ is on the surface of the surface layer of the second excitation electrode than on the surface of the surface layer of the first excitation electrode.

4. The piezoelectric resonator unit according to claim 1, wherein the base member has a flat plate shape, and
the lid member has a recess shape having an opening accommodating the piezoelectric resonator.

5. The piezoelectric resonator unit according to claim 4, wherein a thickness of at least part of the first excitation electrode is smaller than a thickness of the second excitation electrode.

6. The piezoelectric resonator unit according to claim 1, wherein a thickness of the surface layer of the first excitation electrode is larger than a thickness of the surface layer of the second excitation electrode.

7. The piezoelectric resonator unit according to claim 1, wherein the piezoelectric resonator further includes a pair of connection electrodes on the piezoelectric element,
each of the pair of connection electrodes includes an underlying layer containing chromium and a surface layer, and
chromium oxide is on at least a part of the surfaces of the surface layers in each of the pair of connection electrodes.

8. The piezoelectric resonator unit according to claim 1, wherein the piezoelectric resonator unit further includes an extended electrode that electrically connects the first excitation electrode and the first connection electrode, and a thickness of at least a part of the first excitation electrode is smaller than a thickness of the extended electrode.

* * * * *